US012604674B2

(12) United States Patent
Radens et al.

(10) Patent No.: US 12,604,674 B2
(45) Date of Patent: Apr. 14, 2026

(54) BACK SIDE PHASE CHANGE MEMORY (PCM) WITH PCM BACK SIDE SOURCE/DRAIN CONTACT STRUCTURE

(71) Applicant: International Business Machines Corporation, Armonk, NY (US)

(72) Inventors: Carl Radens, LaGrangeville, NY (US); Ruilong Xie, Niskayuna, NY (US); Kangguo Cheng, Schenectady, NY (US); Julien Frougier, Albany, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 739 days.

(21) Appl. No.: 17/893,651

(22) Filed: Aug. 23, 2022

(65) Prior Publication Data

US 2024/0074333 A1 Feb. 29, 2024

(51) Int. Cl.
*H10N 70/20* (2023.01)
*H01L 23/48* (2006.01)
(Continued)

(52) U.S. Cl.
CPC ......... *H10N 70/231* (2023.02); *H01L 23/481* (2013.01); *H10B 63/34* (2023.02); *H10N 70/253* (2023.02); *H10N 70/8613* (2023.02)

(58) Field of Classification Search
CPC ............... H10N 70/231; H10N 70/253; H10N 70/8613; H10N 70/823; H10N 70/826;
(Continued)

(56) References Cited

U.S. PATENT DOCUMENTS 9,865,654 B1 1/2018 He et al.
10,541,365 B1 * 1/2020 Lin ...................... H10N 70/231
(Continued)

FOREIGN PATENT DOCUMENTS

CN 1956208 A * 5/2007 .......... H10N 70/826
CN 102185108 A 9/2011
(Continued)

OTHER PUBLICATIONS

IMEC, "Benefits of 3D-SOC design and backside interconnects for future high-performance systems" (Dec. 13, 2021), 4 pages, retrieved May 9, 2022 from https://techxplore.com/news/2021-12-benefits-3d-soc-backside-interconnects-future.html.
(Continued)

*Primary Examiner* — Scott B Geyer
(74) *Attorney, Agent, or Firm* — Scully, Scott, Murphy & Presser, P.C.; Yuanmin Cai

(57) ABSTRACT

A semiconductor structure is provided in which a phase change memory (PCM) device region including a PCM is located in a back side of a wafer. A PCM device back side source/drain contact structure connects the PCM to a first source/drain structure of a first field effect transistor (FET) that is present in a front side of the wafer, the second source/drain structure of the first FET is connected to a front side BEOL structure by a front side source/drain contact structure. A logic device region and/or an analog device region can be located laterally adjacent to the PCM device region. A back side power distribution network can be present in the logic device region and/or an analog device region.

15 Claims, 12 Drawing Sheets

100

(51) Int. Cl.
　　*H10B 63/00*　　　　(2023.01)
　　*H10N 70/00*　　　　(2023.01)
(58) Field of Classification Search
　　CPC .. H10N 70/8828; H01L 23/481; H10B 63/34;
　　　　　　　　　　　　　　H10B 63/80; H10B 63/10
　　See application file for complete search history.

(56) References Cited

U.S. PATENT DOCUMENTS

| | | | | |
|---|---|---|---|---|
| 10,636,739 | B2 | 4/2020 | Beyne et al. | |
| 10,797,139 | B2 | 10/2020 | Morrow et al. | |
| 10,833,089 | B2 | 11/2020 | Pille et al. | |
| 10,916,540 | B2* | 2/2021 | El-Hinnawy | H10D 84/05 |
| 10,985,064 | B2 | 4/2021 | Zhang et al. | |
| 11,119,146 | B1* | 9/2021 | Chong | H01L 22/14 |
| 2005/0212037 | A1* | 9/2005 | Pinnow | H10N 70/8265 |
| | | | | 257/326 |
| 2006/0211231 | A1* | 9/2006 | Asano | H10B 63/30 |
| | | | | 438/593 |
| 2007/0210334 | A1* | 9/2007 | Lim | H10N 70/231 |
| | | | | 257/E45.002 |
| 2008/0068879 | A1* | 3/2008 | Ahn | H10N 70/884 |
| | | | | 438/102 |
| 2008/0108174 | A1* | 5/2008 | Park | H10N 70/826 |
| | | | | 438/102 |
| 2008/0280390 | A1* | 11/2008 | Kim | H10B 63/30 |
| | | | | 438/95 |
| 2009/0034355 | A1* | 2/2009 | Wang | H10B 63/80 |
| | | | | 365/230.01 |
| 2009/0075420 | A1* | 3/2009 | Bae | H10N 70/066 |
| | | | | 438/102 |
| 2009/0097305 | A1* | 4/2009 | Bae | H10N 70/068 |
| | | | | 365/163 |
| 2010/0012913 | A1* | 1/2010 | Lee | H10N 70/00 |
| | | | | 257/E47.001 |
| 2010/0163826 | A1* | 7/2010 | Peters | H10N 70/823 |
| | | | | 257/E47.001 |
| 2012/0088347 | A1* | 4/2012 | Choi | H10N 70/041 |
| | | | | 257/E21.52 |
| 2012/0231603 | A1* | 9/2012 | Im | H10N 70/826 |
| | | | | 257/E21.09 |
| 2012/0267595 | A1* | 10/2012 | Fang | H10N 70/061 |
| | | | | 257/E45.001 |
| 2013/0051115 | A1 | 2/2013 | En et al. | |
| 2013/0105756 | A1* | 5/2013 | Kim | H10N 70/231 |
| | | | | 257/E47.001 |

| | | | | |
|---|---|---|---|---|
| 2014/0103286 | A1* | 4/2014 | Chu | H10N 70/011 |
| | | | | 438/60 |
| 2016/0064656 | A1* | 3/2016 | Lin | H10N 70/8613 |
| | | | | 257/5 |
| 2017/0054005 | A1* | 2/2017 | Lam | H10N 70/231 |
| 2017/0104154 | A1* | 4/2017 | Kim | H10N 70/066 |
| 2018/0005786 | A1* | 1/2018 | Navarro | H01P 1/184 |
| 2018/0090542 | A1* | 3/2018 | Gourvest | H10B 63/82 |
| 2018/0145030 | A1 | 5/2018 | Beyne et al. | |
| 2018/0218973 | A1 | 8/2018 | Nelson et al. | |
| 2019/0016488 | A1 | 1/2019 | Peccetti | |
| 2020/0105671 | A1 | 4/2020 | Lai et al. | |
| 2020/0373242 | A1 | 11/2020 | Hiblot et al. | |
| 2021/0104435 | A1 | 4/2021 | Son et al. | |
| 2021/0111115 | A1 | 4/2021 | Morrow et al. | |
| 2021/0118798 | A1 | 4/2021 | Liebmann et al. | |
| 2021/0134721 | A1 | 5/2021 | Chiang et al. | |
| 2021/0135102 | A1* | 5/2021 | Lin | G11C 13/0007 |
| 2021/0202385 | A1 | 7/2021 | Huang et al. | |
| 2021/0296396 | A1 | 9/2021 | Wu et al. | |
| 2021/0296580 | A1* | 9/2021 | Shen | H10N 70/063 |
| 2021/0320122 | A1 | 10/2021 | Zhang et al. | |
| 2021/0336138 | A1* | 10/2021 | Lee | H10N 70/8828 |
| 2022/0013467 | A1 | 1/2022 | Lee et al. | |
| 2022/0149275 | A1* | 5/2022 | Ok | H10D 1/474 |
| 2022/0284958 | A1* | 9/2022 | Cohen | G11C 13/0004 |
| 2022/0416157 | A1* | 12/2022 | Cheng | H10N 70/8413 |
| 2023/0029141 | A1* | 1/2023 | Cheng | H10N 70/231 |
| 2023/0066312 | A1* | 3/2023 | Zhu | H10B 41/27 |
| 2023/0068754 | A1* | 3/2023 | Cheng | H10N 70/253 |
| 2023/0129619 | A1* | 4/2023 | Ok | H10N 70/026 |
| | | | | 365/163 |
| 2023/0402514 | A1* | 12/2023 | Cheng | H10D 30/6729 |

FOREIGN PATENT DOCUMENTS

| | | | |
|---|---|---|---|
| CN | 101783390 | B | 5/2013 |
| CN | 105659376 | B | 3/2019 |
| CN | 113488391 | A | 10/2021 |
| CN | 113711356 | A | 11/2021 |
| CN | 114823508 | A | 7/2022 |
| CN | 109983594 | B | 6/2023 |
| WO | 2024/041049 | A1 | 2/2024 |

OTHER PUBLICATIONS

International Search Report and Written Opinion dated Aug. 21, 2023, received in a corresponding foreign application, 8 pages.

\* cited by examiner

100

100

BACK SIDE PHASE CHANGE MEMORY (PCM) WITH PCM BACK SIDE SOURCE/DRAIN CONTACT STRUCTURE

BACKGROUND

The present application relates to semiconductor technology, and more particularly to a semiconductor structure including a phase change memory (PCM) that is located in a back side of a wafer, and a method of forming the same.

PCM is a type of non-volatile random access memory (NVRAM). A NVRAM retains its information when the power is turned off. This is in contrast to dynamic random access memory (DRAM) and static random access memory (SRAM), which both maintain data only for as long as power is applied. A typically PCM includes a material stack of, a bottom electrode, a phase change memory material that exhibits a change in atomic order (from crystalline to amorphous, or vice versa), and a top electrode. The top and bottom electrodes are composed of a conductive material such as, for example, titanium nitride (TiN) or tungsten (W). PCM has emerged as a viable option for machine learning technologies. For example, PCM can be used to represent weights of a neural network for artificial intelligence (AI) applications.

A PCM cell includes a PCM and an access device such as, for example, a field effect transistor (FET). Access devices are typically prebuilt underneath a PCM utilizing so-called front-end-of-the-line (FEOL) processes, and the PCM is usually formed later in a back-end-of-the-line (BEOL) structure utilizing so-called BEOL processes.

SUMMARY

A semiconductor structure is provided in which a PCM device region including a PCM is located in a back side of a wafer. A PCM device back side source/drain contact structure connects the PCM to a first source/drain structure of a first FET that is present in a front side of the wafer, the second source/drain structure of the first FET is connected to a front side BEOL structure by a front side source/drain contact structure. A logic device region and/or an analog device region can be located laterally adjacent to the PCM device region. A back side power distribution network can be present in the logic device region and/or an analog device region.

In one aspect of the present application, a semiconductor structure is provided. In one embodiment of the present application, the semiconductor structure includes a PCM including at least a PCM element located in a PCM device region and on a back side of a wafer. The structure further includes a first FET located in the PCM device region and on a front side of the wafer, and a PCM back side source/drain contact structure is also present that connects the PCM to a first source/drain structure of the first FET that is present in the PCM device region.

In some embodiments of the present application, the PCM back side source/drain contact structure is spaced apart from the PCM element by a heater. In such embodiments, the heater serves as a first electrode of the PCM memory. In such embodiments, the PCM back side source/drain contact structure and the heater are located in a contact opening that is present in a back side dielectric material stack. In such embodiments, the PCM element is present in a PCM-containing pillar that is located on a surface of the heater and a surface of the back side dielectric material stack, the PCM-containing pillar includes a second electrode located on the PCM element, and a PCM dielectric spacer located adjacent to the PCM-containing pillar. In such embodiments, a back side power distribution network can be located in the PCM device region, wherein the back side power distribution network is connected to the second electrode by a contact via structure. In such embodiments, the contact via structure and the PCM-containing pillar are embedded in a back side interlayer (ILD) material layer that is positioned between the back side power distribution network and the back side dielectric material stack. In such embodiments, a front side source/drain contact structure can connect a second source/drain structure of the first FET transistor to a front side back-end-of-the-line (BEOL) structure. In such embodiments, a carrier wafer can be located on a surface of the front side BEOL structure.

In some embodiments of the present application, the PCM back side source/drain contact structure and the PCM element are located in a contact opening that is present in a back side dielectric material stack. In such embodiments, a back side power rail can be located on a surface of the PCM element and a surface of the back side dielectric material stack. In such embodiments, a back side signal line can be located in the PCM device region, wherein the back side signal line is connected to the back side power rail by a contact via structure. In such embodiments, the back side power rail and the contact via structure are embedded in a back side ILD material layer that is positioned between the back side signal line and the back side dielectric material stack. In such embodiments, a front side source/drain contact structure can connect a second source/drain structure of the first FET to a front side BEOL structure. In such embodiments, a carrier wafer can be located on a surface of the front side BEOL structure.

In some embodiments of the present application, the PCM back side source/drain contact structure entirely fills a contact opening that is present in a back side dielectric material stack, and the PCM element is present on the PCM back side source/drain structure and the back side dielectric material stack, and a dielectric material layer is located on a surface of the PCM element. In such embodiments, a back side ILD material layer can be located on the back side dielectric material stack and embedding the PCM element and the dielectric material layer. In such embodiments, a back side signal line can be located on the back side ILD material layer, wherein the back side signal line is connected to the PCM element by a contact via structure and a back side power rail, wherein the contact via structure forms a first interface with the back side signal layer and a second interface with the back side power rail, and the back side power rail forms an interface with the PCM element and passes through the dielectric material layer. In such embodiments, a front side source/drain contact structure can connect a second source/drain structure of the first FET to a front side BEOL structure.

In some embodiments of the present application, the structure can further include a second FET located in the front side of the wafer and in a logic device region that is located laterally adjacent to the PCM device region, wherein a logic device back side source/drain contact structure connects a first source/drain structure of the second FET to a back side power rail, and a logic device front side source/drain contact structure connects a second source/drain structure of the second FET to a front side BEOL structure. In such embodiments, a back side power distribution network can be connected to the back side power rail present in the logic device region by a contact via structure.

In another aspect of the present application, a method of forming a semiconductor structure is provided. The method of the present application will become more apparent by referring to the drawings and the detailed description of the present application which follows.

DETAILED DESCRIPTION

Figure 1B:
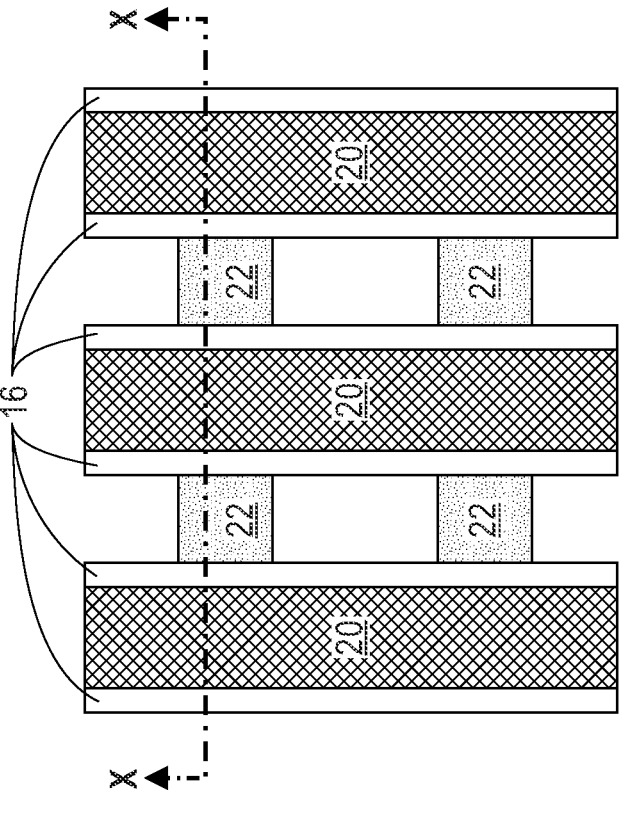
FIG. 1B is a top down view of the exemplary structure shown in FIG. 1A; cut X-X which passes through each nanosheet containing FET is shown.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
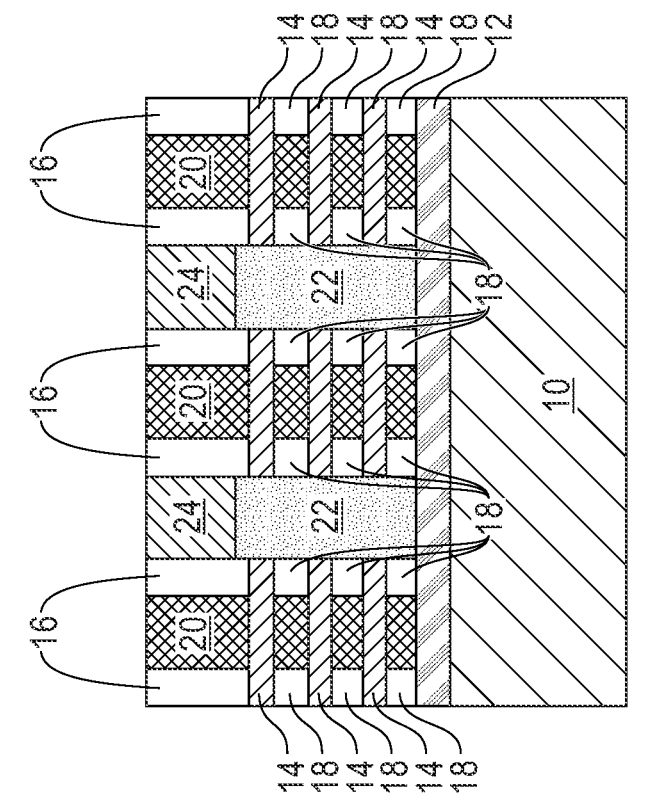
FIG. 1A is a cross sectional view through cut X-X shown in FIG. 1B of an exemplary structure in a PCM device region that can be employed in accordance with an embodiment of the present application, the exemplary structure includes a semiconductor substrate, a bottom dielectric isolation layer, a plurality of nanosheet containing FETs located on the bottom dielectric isolation layer, source/drain structures and a front side interlayer dielectric material (ILD) layer located on the source/drain structures, wherein each nanosheet containing FET includes a nanosheet stack of spaced apart semiconductor channel material nanosheets and a functional gate structure wrapped around each semiconductor channel material nanosheet of the nanosheet stack.

Referring first to FIG. 1A, there is illustrated an exemplary structure in a PCM device region 100 that can be employed in accordance with an embodiment of the present application. Notably, the exemplary structure shown in FIG. 1A is through cut X-X that is shown in FIG. 1B; FIG. 1B is a top down view of the same exemplary structure with the front side interlayer dielectric (ILD) material layer 34 omitted to show the location of the source/drain structures 22 that are present on each side of the functional gate structures 20. Although the present application describes and illustrates nanosheet containing field effect transistors (i.e., FETs including a functional gate structure that is wrapped around semiconductor channel material nanosheets), the present application works equally for other types of FETs including, but not limited to, planar FETs, finFETs, and nanowire FETs. It is also noted that other types of device regions including logic device regions and/or analog device regions can be present adjacent to the PCM device region 100. In such embodiments, and in those other device regions, those regions would include the same exemplary structure, i.e., nanosheet containing FETs, which are shown in FIG. 1A at this point of the present application.

Referring back to the exemplary structure shown in FIG. 1A, the exemplary structure includes a semiconductor substrate 10, a bottom dielectric isolation layer 12, a plurality of nanosheet containing FETs located on the bottom dielectric isolation layer 12, source/drain structures 22 and a front side interlayer dielectric material (ILD) layer 24 located on the source/drain structures 22, wherein each nanosheet containing FET includes a nanosheet stack of spaced apart semiconductor channel material nanosheets 14 and a functional gate structure 20 wrapped around each semiconductor channel material nanosheet 14 of the nanosheet stack. Also present are dielectric spacers 16 which are located laterally adjacent to an upper portion of each functional gate structure 20 and inner spacers 28 which are located laterally adjacent a remaining portion of each functional gate structure 20, and between end portions of each semiconductor channel material nanosheet 14 that is present in the nanosheet stack.

The semiconductor substrate 10 is composed of at least one semiconductor material having semiconducting properties. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, the semiconductor substrate 10 is a bulk semiconductor substrate (i.e., the semiconductor substrate 10 is composed entirely of at least one semiconductor material). In one embodiment, the bulk semiconductor substrate that can be used as semiconductor substrate 10 is composed entirely of silicon. In other embodiments, the semiconductor substrate 10 is a semiconductor-on-insulator (SOI) substrate. SOI substrates typically include a bottom semiconductor material layer, a buried dielectric material layer and a top semiconductor material layer. The bottom and top semiconductor material layers can include one of the semiconductor materials mentioned above for the semiconductor substrate 10 and the semiconductor material that provides the bottom semiconductor material layer can be compositionally the same as, or compositionally different from, the semiconductor material that provides the top semiconductor layer. The buried dielectric material layer can be composed of a dielectric material such as, for example, silicon dioxide and/or boron nitride. In example, the SOI substrate that can be used as the semiconductor substrate 10 incudes silicon-silicon dioxide-silicon.

Each semiconductor channel material nanosheet 14 is composed of one of the semiconductor materials mentioned above for the semiconductor substrate 10. The semiconductor material that provides each semiconductor material nanosheet 14 can be compositionally the same as, or compositionally different from, a semiconductor material that is present in an upper portion of the semiconductor substrate 10. In some embodiments, each semiconductor channel material nanosheet 14 is composed of a semiconductor material capable of providing high channel mobility for NFET devices. In other embodiments, each semiconductor channel material nanosheet 14 is composed of a semiconductor material capable of providing high channel mobility for PFET devices. In one example, each semiconductor material nanosheet 14 is composed of silicon.

Each semiconductor channel material nanosheet 14 can have a width from 20 nm to 130 nm, a length from 10 nm to 130 nm, and a vertical height from 4 nm to 20 nm. Other widths and/or lengths and/or vertical heights however can be used for each semiconductor channel material nanosheet 14 provided that the width and/or length and/or vertical height that are selected meet nanosheet specifications.

Each functional gate structure 20 includes at least a gate dielectric material layer and a gate electrode; the gate dielectric material layer and the gate electrode are not separately illustrated in the drawings of the present application. The functional gate structure 20 wraps around the semiconductor channel material nanosheets 14 as shown in FIG. 1A. As is known, the gate dielectric material layer of the functional gate structure 20 is in direct contact with physically exposed portions of each semiconductor channel material nanosheet 14, and the gate electrode is located on the gate dielectric material layer. In some embodiments, the gate structure includes a work function metal (WFM) layer (not shown) located between the gate dielectric material layer and the gate electrode. In other embodiments, the WFM layer is used solely as the gate electrode.

The gate dielectric material layer of each functional gate structure 20 is composed of a gate dielectric material such as, for example silicon oxide, or a dielectric material having a dielectric constant greater than 4.0 (such dielectric materials can be referred to as a high-k gate dielectric material). All dielectric constants mentioned herein are measured in a vacuum unless otherwise stated. Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb($Sc,Ta$)$O_3$), and/or lead zinc niobite (Pb($Zn,Nb$)O). The high-k gate dielectric material can further include dopants such as lanthanum (La), aluminum (Al) and/or magnesium (Mg).

The gate electrode of each functional gate structure 20 can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, or nickel silicide.

In some embodiments, a WFM layer can be employed as either the electrically conductive metal-containing material that provides the gate electrode or as a separate layer that is located between the gate dielectric material prior layer and the gate electrode. The WFM layer can be used to set a threshold voltage of the FET to a desired value. In some embodiments, the WFM layer can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM layer can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The dielectric spacer 16 is composed of a gate spacer dielectric material. Examples of gate spacer dielectric materials that can be used in providing the dielectric spacer 16 include, but are not limited to, SiN, SiBCN, SiOCN or SiOC.

The bottom dielectric isolation layer 12 is composed of one of the gate spacer dielectric materials mentioned above for dielectric spacer 16. The bottom dielectric isolation layer 12 and dielectric spacer 16 are typically formed at the same time, thus they are composed of a compositionally same gate spacer dielectric material. The bottom dielectric isolation layer 12 can have a thickness from 5 nm to 50 nm; although other thicknesses for the bottom dielectric isolation layer 12 are contemplated and can be employed as the thickness of the bottom dielectric isolation layer 12.

The inner spacer 18 is composed one of the gate spacer dielectric materials mentioned above for dielectric spacer 16. The gate spacer dielectric material that provides the inner spacer 18 can be compositionally the same as, or compositionally different from, the gate dielectric spacer material that provides the dielectric spacer 16.

Each source/drain structure 22, which extends outward from a sidewall of each semiconductor channel material nanosheet 14, is composed of a semiconductor material and a dopant. As used herein, a "source/drain or S/D" structure can be a source region or a drain region depending on subsequent wiring and application of voltages during operation of the field effect transistor (FET). The semiconductor material that provides the source/drain structure 22 can include one of the semiconductor materials mentioned above for the semiconductor substrate 10. The semiconductor material that provides the source/drain structure 22 can be compositionally the same, or compositionally different from, each semiconductor channel material nanosheet 14. The dopant that is present in the source/drain structure 22 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain structure 22 can have a dopant concentration of from $4 \times 10^{20}$ atoms/cm$^3$ to $3 \times 10^{21}$ atoms/cm$^3$. In one example, the source/drain structure 22 is composed of phosphorus doped silicon.

The front side ILD material layer 26, which is present on top of each source/drain structure 22, can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0.

The exemplary structure shown in FIG. 1A can be formed utilizing any well-known nanosheet transistor formation process. So as not to obscure the method of the present application and the resultant structure that is formed by the method of the present application, the processing steps used in forming the exemplary structure shown in FIG. 1A are not described herein.

Figure 2:
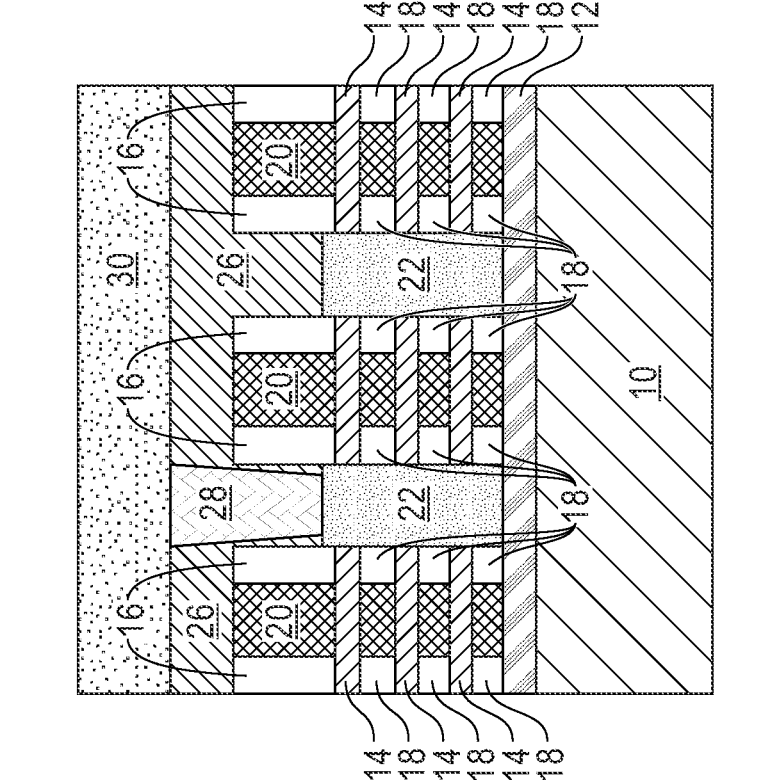
FIG. 2 is cross sectional view of the exemplary structure shown in FIG. 1A after forming additional front side ILD material, a front side source/drain contact structure, and a front side BEOL structure.

Referring now to FIG. 2, there is illustrated the exemplary structure shown in FIG. 1A after forming additional front side ILD material, a front side source/drain contact structure 28, and a front side BEOL structure 30. A similar structure is formed in the laterally adjacent device regions, e.g., the logic device region.

The additional front side ILD material is formed on top of the front side ILD material layer 24 and on top of the topmost surface of each functional gate structure 20. The additional front side ILD material can include one of the dielectric materials mentioned above for the front side ILD material layer 24. The dielectric material that provides the additional front side ILD material can be compositionally the same as, or compositionally different from, the dielectric material that provides the front side ILD material layer 24. In the present application, the combination of the front side ILD material layer 24 and the additional ILD material provides a front side ILD material structure 26 as is shown in FIG. 2. The additional ILD material can be formed by a deposition process such as, for example, chemical vapor deposition (CVD), plasma enhanced chemical vapor deposition (PECVD), or spin-on coating. Such deposition processes are used in forming the front side ILD material layer 24 shown in FIG. 1A.

Next, a front side source/drain contact structure 28 is formed in each of the different device regions. As is shown in FIG. 2, the front side source/drain contact structure 28 in the PCM device region 100 extends completely through the front side ILD material structure 26 and directly contacts a surface of one of the source/drain structures 22 that is located on top of the bottom dielectric isolation layer 12. The front side source/drain contact structure 28 can include a contact conductor material such as, for example, W, Cu, Al, Co, Ru, Mo, Os, Jr, Rh, or an alloy thereof. In embodiments, the front side source/drain contact structure 28 can also include a silicide liner such as TiSi, NiSi, NiPtSi, etc., and an adhesion metal liner, such as TiN. The contact conductor material can be formed by any suitable deposition method such as, for example, atomic layer deposition (ALD), CVD, physical vapor deposition (PVD) or plating. The front side source/drain contact structure 28 can be formed by forming a trench in the front side ILD material structure 26 that physically exposes a surface of one of the source/drain structures 22. Each trench is then filled with a contact conductor material, and then planarized to remove any contact conductor material that is located outside the trenches.

In some embodiments (not shown), a metal semiconductor alloy region can be formed in each of the trenches that physically expose the source/drain structure 22 that is located on top of the bottom dielectric isolation layer 12. The metal semiconductor alloy region can be composed of a silicide or germicide. In one or more embodiments of the present application, the metal semiconductor alloy region can be formed by first depositing a metal layer (not shown) in the trenches. The metal layer can include a metal such as Ni, Co, Pt, W, Ti, Ta, a rare earth metal (e.g., Er, Yt, La), an alloy thereof, or any combination thereof. The metal layer can be deposited by CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain structure 22 to provide the metal semiconductor alloy region. The unreacted portion of the metal layer, and, if present, the diffusion barrier, are then removed, for example, by an etch process (or a plurality of etching processes). In one embodiment, the etching process can be a wet etch that removes the metal in the metal layer selective to the metal semiconductor alloy in the metal semiconductor alloy regions.

The front side source/drain contact structure 28 can include one or more source/drain contact liners (not shown) formed along sidewalls of trenches prior to forming the front side source/drain contact structure 28. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

The front side BEOL structure 30 includes one or more interconnect dielectric material layers that contain one or more wiring regions embedded thereon. The front side BEOL structure 30 can be formed utilizing BEOL processing techniques that are well known to those skilled in the art.

As is shown in FIG. 2, the front side source/drain contact structure 28 has a first surface that directly contacts a surface of the front side BEOL structure 30 and a second surface, opposite the first surface, that directly contacts one of the source/drain structure 22.

Figure 3:
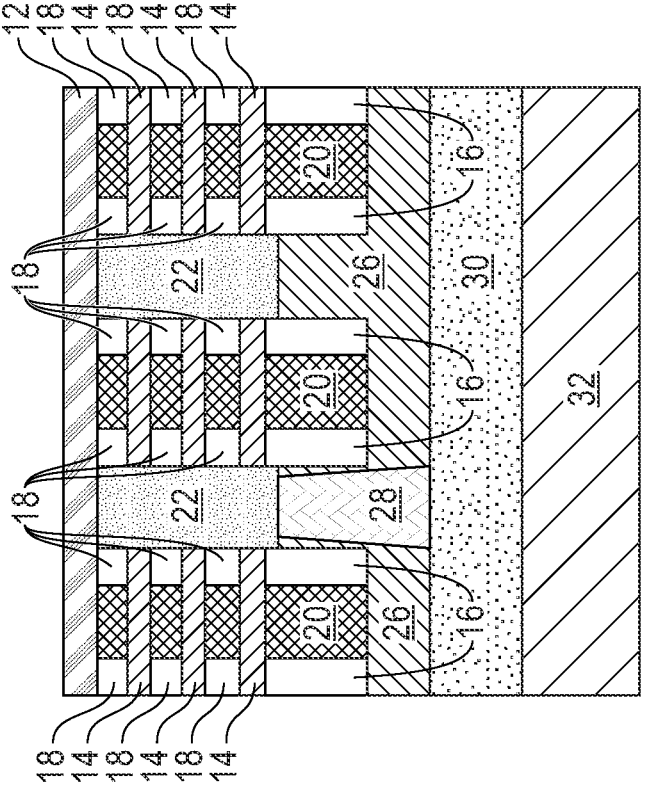
FIG. 3 is a cross sectional view of the exemplary structure shown in FIG. 2 after flipping the structure 180°, forming a carrier wafer on the front side BEOL structure, and removing the semiconductor substrate.

Referring now to FIG. 3, there is illustrated the exemplary structure shown in FIG. 2 after flipping the structure 180°, forming a carrier wafer 32 on the front side BEOL structure 30, and removing the semiconductor substrate 10. A similar structure is formed in the laterally adjacent device regions, e.g., the logic device region.

In some embodiments, the carrier wafer 32 can be formed on the front side BEOL structure 30 prior to wafer flipping. The carrier wafer 32 can include one of the semiconductor materials mentioned above for the semiconductor substrate 10. In the present application, the carrier wafer 32 is typically bonded to the front side BEOL structure 30 after the front side BEOL structure 30 has been formed on the front side ILD material structure 26. Flipping of the structure can be performed by hand or by utilizing a mechanical means such as, for example, a robot arm. The removal of the semiconductor substrate 10 can be performed utilizing one or more material removal processes that are selective in removing the semiconductor materials and, if present, the buried dielectric material layer that provides the semiconductor substrate 10. After removal of the semiconductor substrate 10, a surface of the bottom dielectric isolation layer 12 is physically exposed and now processing on the back side of the wafer can begin.

Figure 4:
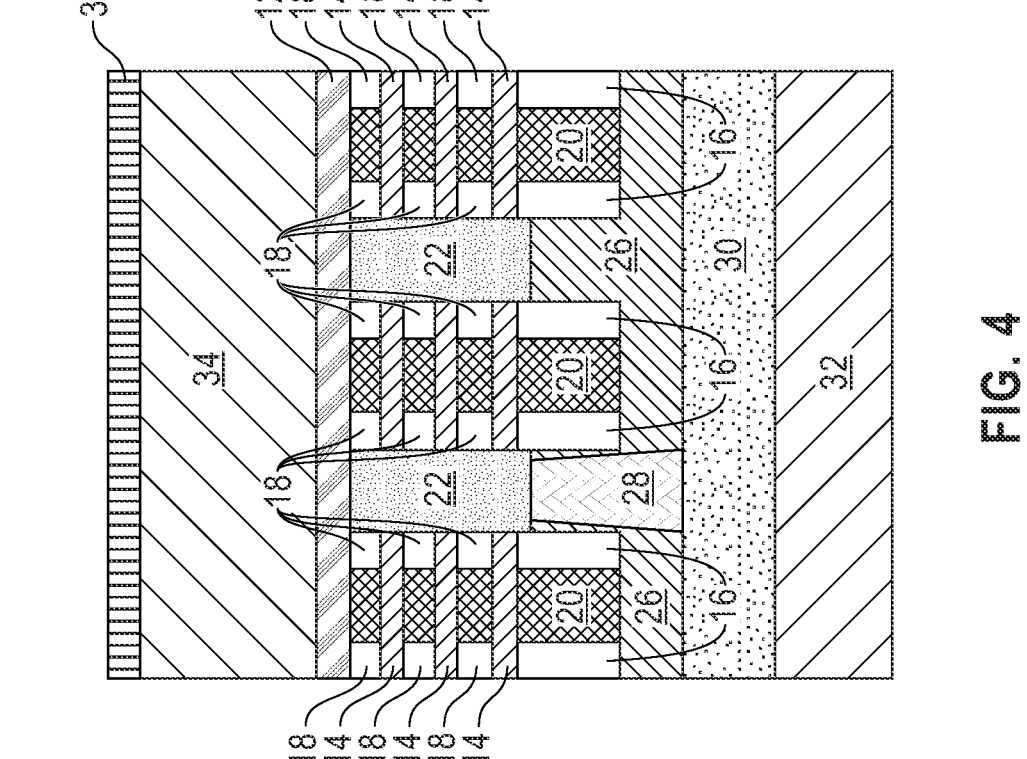
FIG. 4 is a cross sectional view of the exemplary structure shown in FIG. 3 after forming a back side dielectric material layer, and a back side dielectric capping layer.

Referring now to FIG. 4, there is illustrated the exemplary structure shown in FIG. 3 after forming a back side dielectric material layer 34, and a back side dielectric capping layer 36. A similar structure is formed in the laterally adjacent device regions, e.g., the logic device region. Collectively, the back side dielectric material layer 34 and the back side dielectric capping layer 36 can be referred to herein as a back side dielectric material stack.

The back side dielectric material layer 34 can include any dielectric material including one of the dielectric materials mentioned above for the front side ILD material layer 24. In one example, the back side dielectric material layer 34 can be composed of silicon oxide. The back side dielectric material layer 34 can be formed by a deposition process including, for example, CVD, PECVD, ALD, or spin-on coating. The back side dielectric material layer 34 can have a thickness from 20 nm to 200 nm; although other thicknesses for the back side dielectric material layer 34 are contemplated and can be used as the thickness of the back side dielectric material layer 34.

The back side dielectric capping layer 36 is composed of a dielectric material that is compositionally different from the dielectric material layer that provides the back side dielectric material layer 34. In one example, the back side dielectric capping layer 36 is composed of a dielectric material that includes atoms of silicon, carbon, and nitride (i.e., a SiCN dielectric material). Other dielectric materials such as, for example, aluminum nitride or aluminum oxide can be used as the dielectric material that provides the back side dielectric capping layer 36. The back side dielectric capping layer 36 can be formed by a deposition process including, for example, CVD, PECVD, ALD, or spin-on coating. The back side dielectric capping layer 36 can have a thickness from 5 nm to 50 nm; although other thicknesses for the back side dielectric capping layer 36 are contemplated and can be used as the thickness of the back side dielectric capping layer 36.

Figures 5A, 5B:
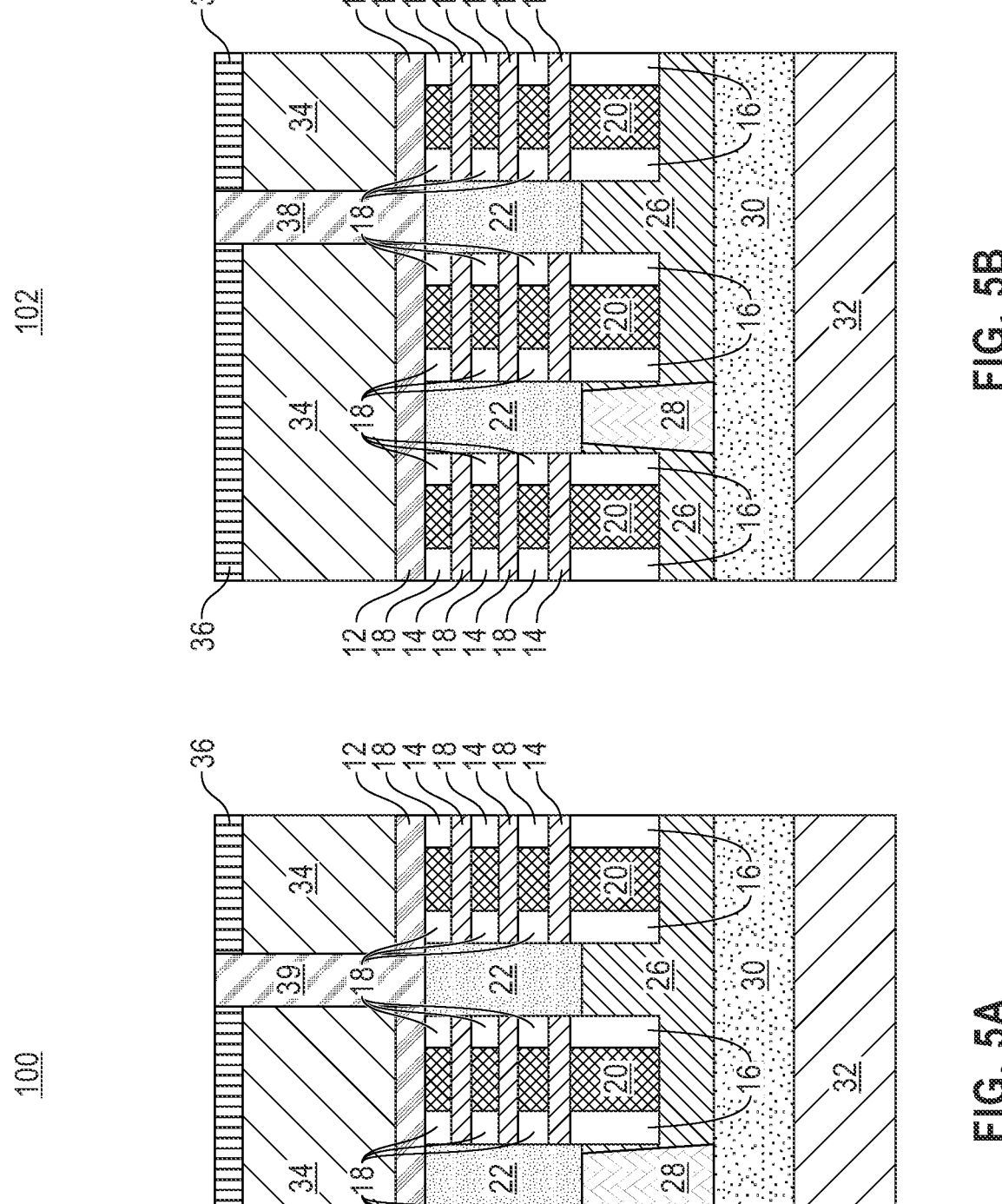
FIG. 5A is a cross sectional view of the exemplary structure shown in FIG. 4 after forming a PCM device back side source/drain contact structure that contacts one of the source/drain structures in the PCM device region.
FIG. 5B is a cross sectional view of an exemplary structure that is present in a logic device region and after forming a logic device back side source/drain contact structure that contacts one of the source/drain structures in the logic device region.

Referring now to FIG. 5A, there is illustrated the exemplary structure shown in FIG. 4 after forming a PCM device back side source/drain contact structure 39 that contacts one of the source/drain structures 22 in the PCM device region 100. Note that the PCM device back side source/drain contact structure 39 contacts the source/drain structure 22 in the PCM device region 100 that is on a side that is opposite a side of the functional gate structure 20 that contains the front side source/drain contact structure 28. FIG. 5B shows the exemplary structure that is present in a logic device region 102 and after forming a logic device back side source/drain contact structure 38 that contacts one of the source/drain structures 22 in the logic device region 102. Note that the logic device back side source/drain contact structure 38 contacts the source/drain structure 22 in the logic device region 102 that is on a side that is opposite a side of the functional gate structure 20 that contains the front side source/drain contact structure 28. In the present application, the various device regions, i.e., the PCM device region 100 and the logic device region 102 are located at a same level of the wafer.

The PCM device back side source/drain contact structure 39 and the logic device back side source/drain contact structure 38 include materials as mentioned above for the front side source/drain contact structure 28. The PCM device back side source/drain contact structure 39 and the logic device back side source/drain contact structure 38 can be formed by first providing a contact opening that extends completely through the back side dielectric material stack and the bottom dielectric isolation layer 12 by lithography and etching. The contact opening is then processes utilizing the processing technique mentioned above in forming the front side source/drain contact structure 28. At this point of the present application, the PCM device back side source/drain contact structure 39 and the logic device back side source/drain contact structure 38 have a physically exposed surface that is coplanar with a physically exposed surface of the back side dielectric capping layer 36.

Figures 6A, 6B:
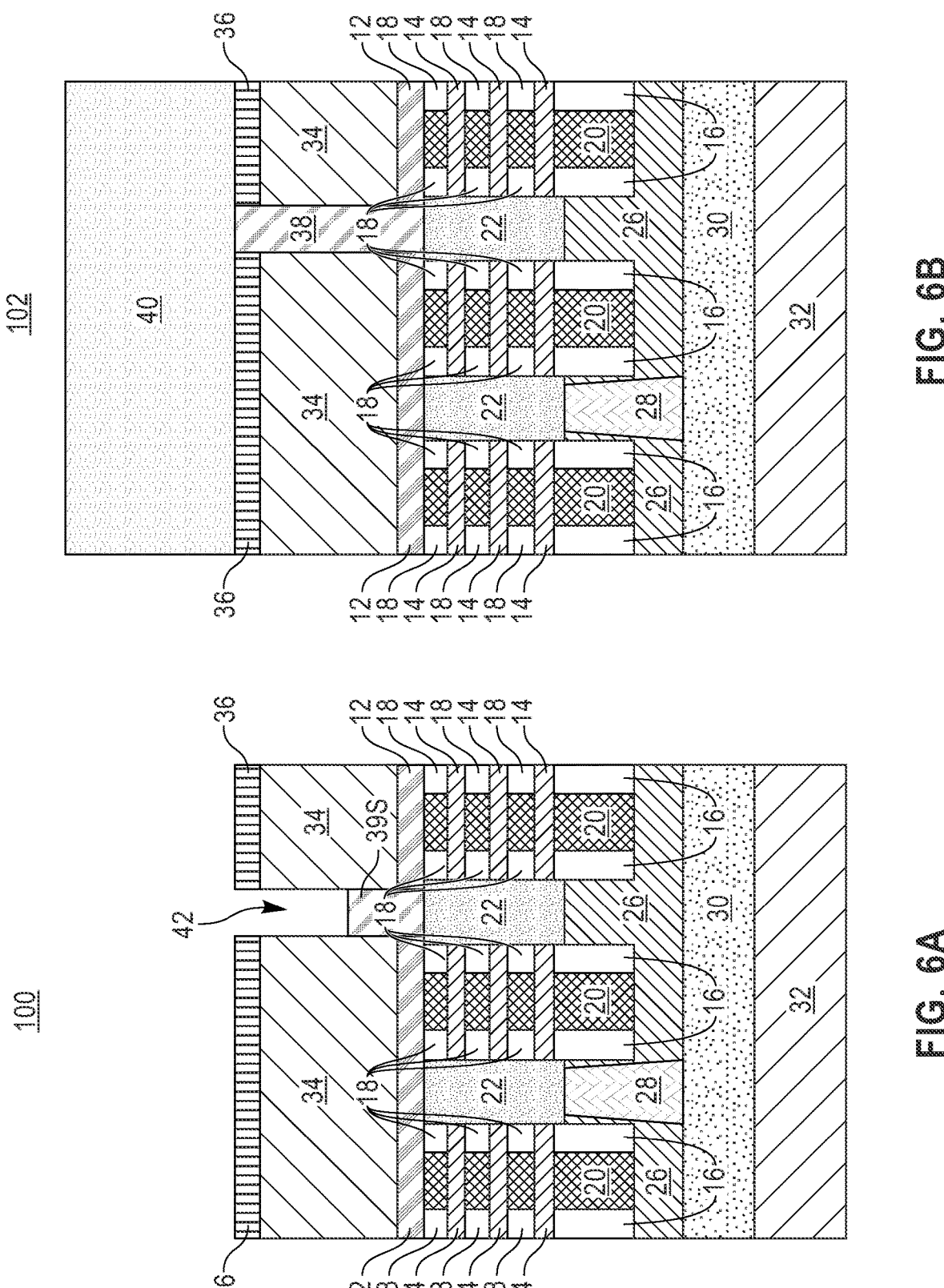
FIGS. 6A and 6B are cross sectional views of the exemplary structures shown in FIGS. 5A and 5B, respectively, after forming a block mask in the logic device region, and recessing the PCM device back side source/drain contact structure in the PCM device region.

Referring now to FIGS. 6A and 6B, there are illustrated the exemplary structures shown in FIGS. 5A and 5B, respectively, after forming a block mask 40 in the logic device region 102, and recessing the PCM device back side source/drain contact structure 39 in the PCM device region 100. At this point of the present application, the recessed PCM device back side source/drain contact structure 39S is present partially in contact opening 42 and the recessed PCM device back side source/drain contact structure 39S has a physically exposed surface that vertically offset and located beneath the exposed surface of the back side dielectric capping layer 36. Typically, and as is shown in FIG. 6A, the recessed PCM device back side source/drain contact structure 39S has a physically exposed surface that extends between a topmost surface and a bottommost surface of the back side dielectric material layer 34. In this embodiment, the recessed PCM device back side source/drain contact structure 39S has a vertical height that is less than a vertical height of the logic device back side source/drain contact structure 38. Block mask 40 includes any block mask material such as, for example, an organic planarization layer (OPL). Block mask 40 can be formed by deposition of the block mask material, followed by lithographic patterning. The recessing of the PCM device back side source/drain contact structure 39S includes an etching process that is selective in partially removing the PCM device back side source/drain contact structure 39 from the contact opening 42.

Figures 7A, 7B:
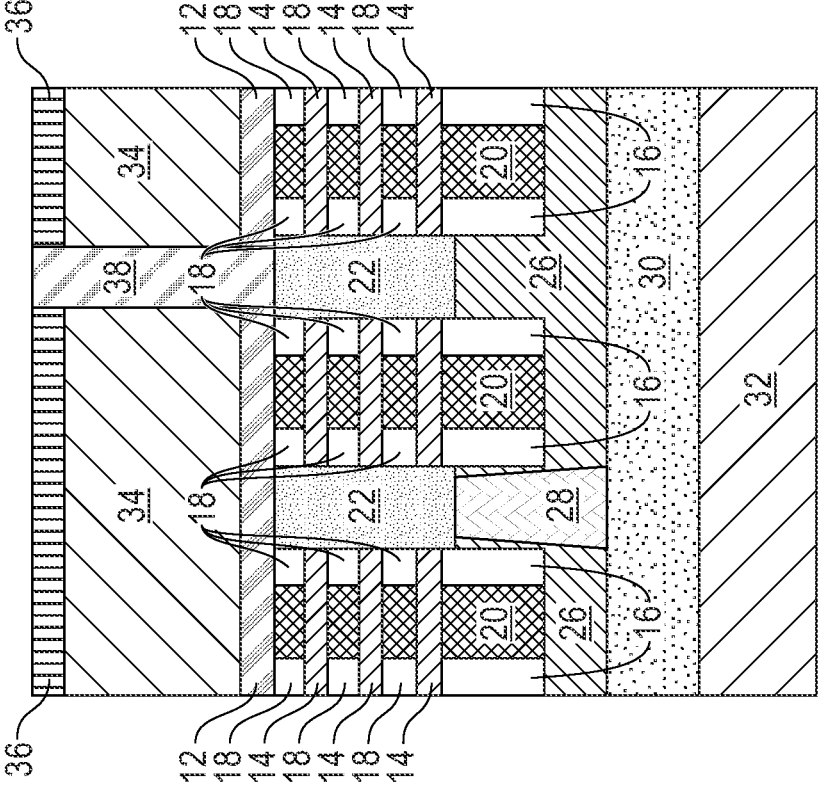
FIGS. 7A and 7B are cross sectional views of the exemplary structures shown in FIGS. 6A and 6B, respectively, after removing the block mask in the logic device region, and forming a heater on the recessed PCM device back side source/drain side contact structure.

Referring now to FIGS. 7A and 7B, there are illustrated the exemplary structures shown in FIGS. 6A and 6B, respectively, after removing the block mask 40 in the logic device region 102, and forming a heater on the recessed PCM device back source/drain side contact structure 39S. The heater is formed in an upper portion of the contact opening 42 and in this embodiment serves as a first electrode of a PCM. The block mask 40 can be removed utilizing a material removal process that is selective in removing the block mask 40 from the logic device region 102.

In some embodiments of the present application, the heater can include a first metal nitride layer 44, a second metal nitride layer 46 and a third metal nitride layer 48. In such embodiments, the first metal nitride layer 44 and third metal nitride layer 48 are compositionally different from the second metal nitride layer 46, and the first metal nitride layer 44 can be compositionally the same as, or compositionally different from, the third metal nitride layer 48. In one example, the first metal nitride layer 44 is composed of TaN, the second metal nitride layer 46 is composed of TiN, and the third metal nitride layer 48 is composed of TaN. Other metal nitrides can be used for the first metal nitride layer 44, the second metal nitride layer 46 and the third metal nitride layer 48. Generally, the metal nitride that can be used in providing the first metal nitride layer 44, the second metal nitride layer 46 and the third metal nitride layer 48 includes TiN, TaN, WN, RuN, W, SiC, or C.

The heater can be formed by deposition of the various metal nitride layers in the contact opening 42 and outside the contact opening 42, followed by a planarization process such as, for example, chemical mechanical polishing (CMP), which removes all metal nitride layers that are formed on top of the back side dielectric material stack. The deposition of the various metal nitrides can include, CVD, PECVD, or ALD. After planarization, each of the first metal nitride layer 44, the second metal nitride layer 46 and the third metal nitride layer 48 has a topmost surface that is coplanar with each other and coplanar with a topmost surface of the back side dielectric material stack.

Figures 8A, 8B:
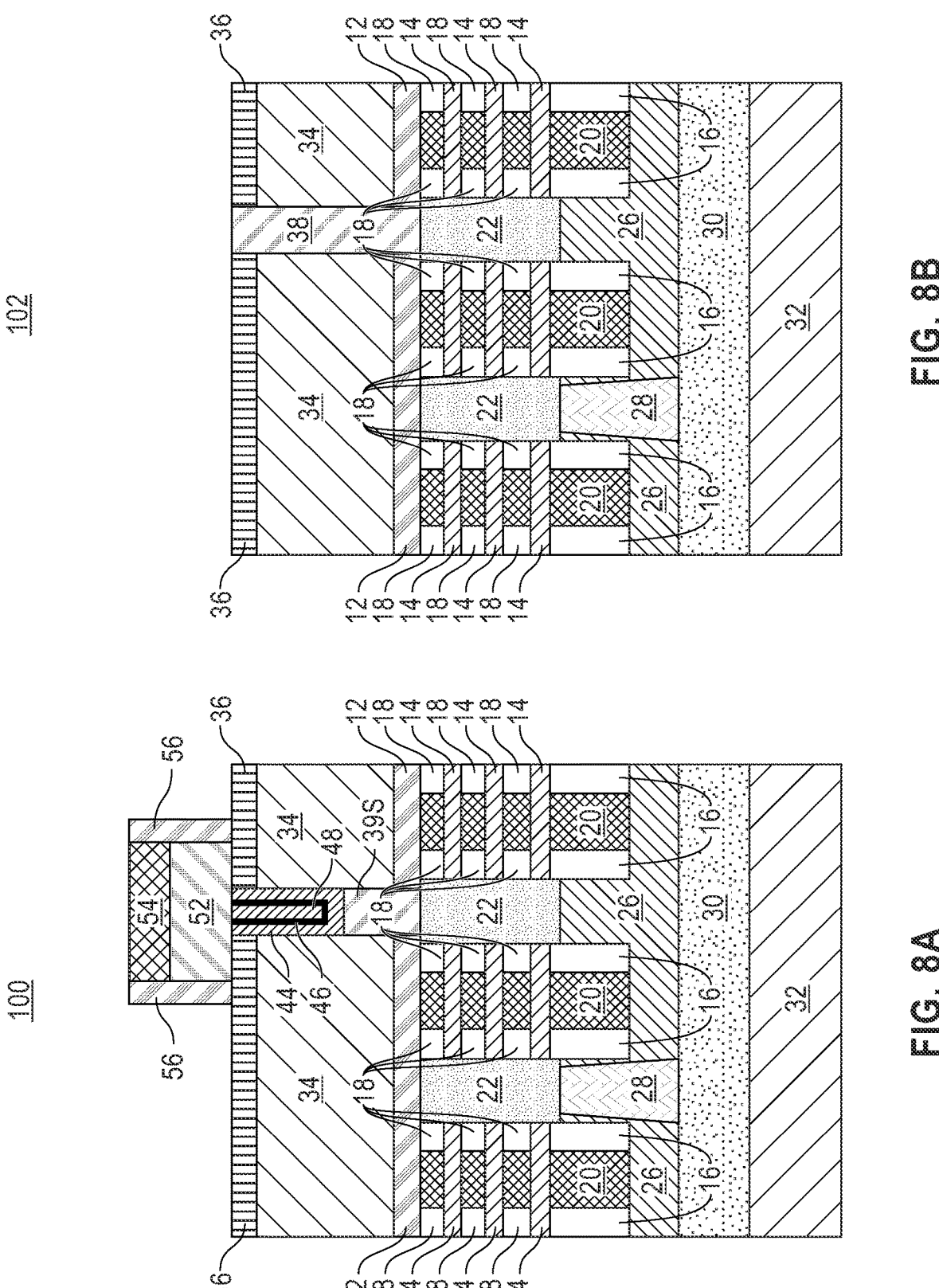
FIGS. 8A and 8B are cross sectional views of the exemplary structures shown in FIGS. 7A and 7B, respectively, after forming a PCM-containing pillar including a PCM element and a second electrode on top of the heater, and forming a PCM dielectric spacer laterally adjacent to the PCM-containing pillar.

Referring now to FIGS. 8A and 8B, there are illustrated the exemplary structures shown in FIGS. 7A and 7B, respectively, after forming a PCM-containing pillar including a PCM element 52 and a second electrode 54 on top of the heater, and forming a PCM dielectric spacer 56 laterally adjacent to the PCM-containing pillar. In this embodiment, the PCM-containing pillar is positioned on the heater and on a portion of the back side dielectric material stack. As such, the PCM element 52 forms an interface with the heater as is shown in FIG. 8A. As shown in FIG. 8A, the PCM element 52 of the PCM-containing pillar has a sidewall that is vertically aligned with a sidewall of the second electrode 54, and the PCM dielectric spacer 56 is present along the sidewalls of both the PCM element 52 and the second electrode 54. The PCM dielectric spacer 56 has a first surface that contacts the back side dielectric material stack, and a second surface that is opposite the first surface that is coplanar with a topmost surface of the second electrode 54.

The PCM element 52 includes a single phase change material or a vertical stack of at least two different phase change materials. The phase change material(s) that provides the PCM element 52 can be composed of a chalcogenide. Chalcogenides are comprised of an element from Group 16 (i.e., a chalcogen) of the Periodic Table of Elements and a more electropositive element. Examples of chalcogens that can be used to provide the PCM element 52 include, but are not limited to, a GeSbTe alloy (GST), a SbTe alloy, or an InSe alloy. Other materials can also be used as the phase change material so long as the other material can retain separate amorphous and crystalline states. In this embodiment of the present application, the PCM element 52 can have a thickness from 20 nm to 200 nm. Other thicknesses can also be employed as the thickness of the PCM element 52.

The second electrode 54 can be composed of an electrically conductive material such as, for example, Ta, TaN, Ti, TiN, Ru, RuN, RuTa, RuTaN, Co, CoWP, CoN, W, WN or any combination thereof. In this embodiment of the present application, the second electrode 54 can have a thickness from 20 nm to 200 nm. Other thicknesses can also be employed as the thickness of the second electrode 54.

The PCM-containing pillar can be formed by depositing blanket layers of the phase change material(s) and the electrically conductive material, and thereafter the blanket layers are lithographically patterned to provide the PCM-containing pillar. The depositing of the blanket layer of phase change material(s) includes, but is not limited to, CVD, PECVD or ALD, and depositing of the blanket layer of electrically conductive material includes, but is not limited to, CVD, PECVD, ALD, or sputtering.

The PCM dielectric spacer 56 can be composed of any dielectric spacer material including, for example, one of the gate dielectric spacer materials mentioned above for dielectric spacer 16. The PCM dielectric spacer 56 can be formed by deposition of the dielectric spacer material, followed by a spacer etch. In some embodiments, the PCM dielectric spacer 56 can be I-shaped as is shown in FIG. 8A.

Figures 9A, 9B:
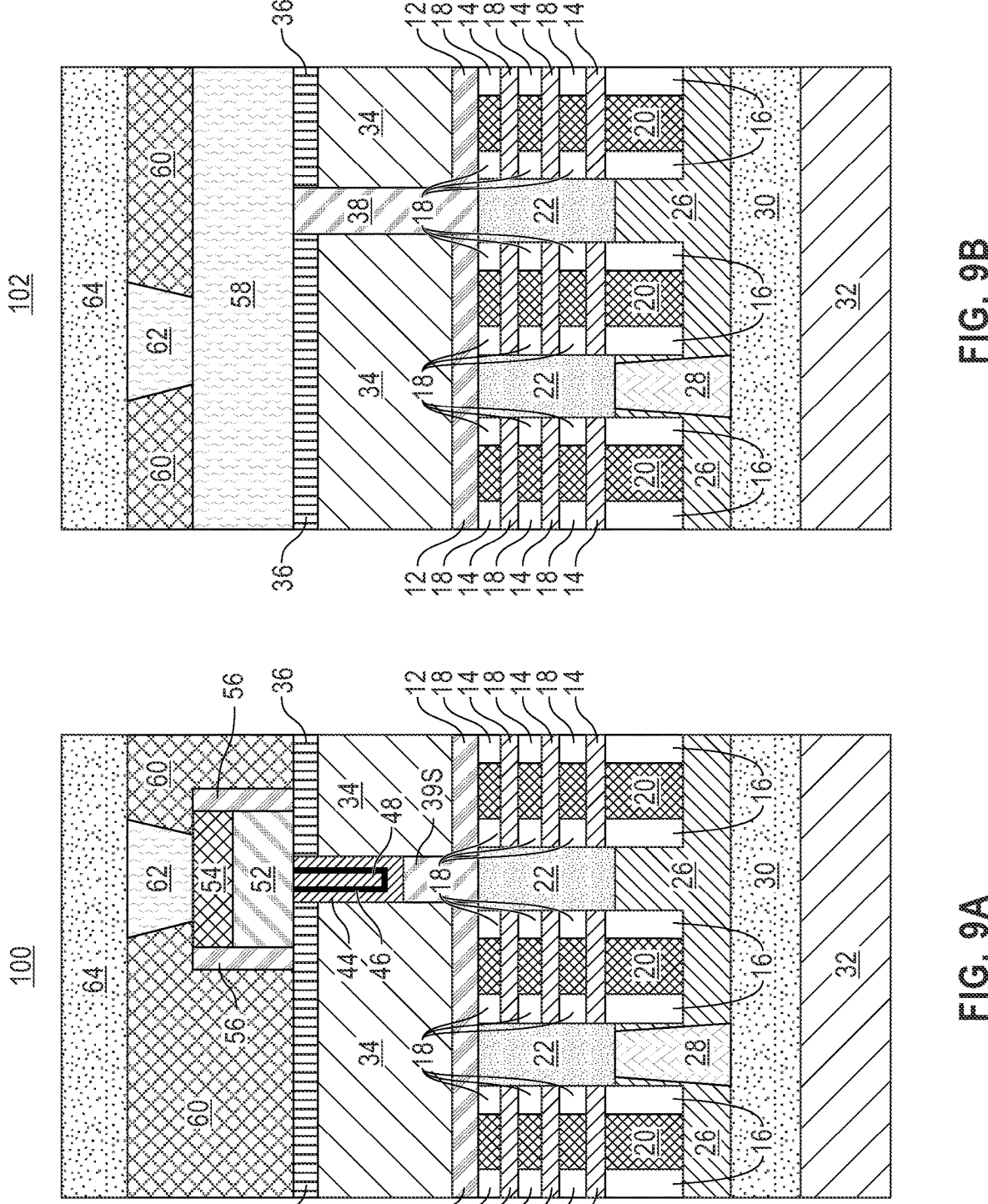
FIGS. 9A and 9B are cross sectional views of the exemplary structures shown in FIGS. 8A and 8B, respectively, after forming a lower portion of a back side ILD material layer in both the PCM device region and the logic device region, forming a back side power rail in the logic device region, forming an upper portion of the back side ILD region, forming an upper portion of the back side ILD material layer in both the PCM device region and the logic device region, forming a contact via structure in the back side ILD material layer in both the PCM device region and the logic device region, and forming a back side power distribution structure in both the PCM device region and the logic device region.

Referring now to FIGS. 9A and 9B, there are illustrated the exemplary structures shown in FIGS. 8A and 8B, respectively, after forming a lower portion of the back side ILD material layer 60 in both the PCM device region 100 and the logic device region 102, forming a back side power rail 58 in the logic device region 102, forming an upper portion of the back side ILD material layer 60 in both the PCM device region 100 and the logic device region 102, forming a contact via structure 63 in the back side ILD material layer 60 in both the PCM device region 100 and the logic device region 102, and forming a back side power distribution structure 64 in both the PCM device region 100 and the logic device region 102.

The lower portion of the back side ILD material layer 60 is first formed utilizing one of the deposition processes mentioned above in forming the front side ILD material layer 24. The lower portion of the back side ILD material layer 60 can include one of the dielectric materials mentioned above for the front side ILD material layer 24.

The back side power rail 58 can be composed of any electrically conductive power rail material including, but not limited to, tungsten (W), cobalt (Co), ruthenium (Ru), aluminum (Al), copper (Cu), platinum (Pt), rhodium (Rh), or palladium (Pd). The back side power rail 58 can be formed within an opening that is formed into the lower portion of the back side ILD material layer 60 that is formed in the logic device region 102. Notably, the back side power rail 58 is formed by deposition of electrically conductive power rail material into the opening that is formed into the lower portion of the back side ILD material layer 60 in the logic device region 102, followed by a planarization. An upper portion of the back side ILD material layer 60 is then formed. The upper portion of the back side ILD material layer 60 can be compositionally the same as, or compositionally different from the dielectric material that provides the lower portion of the back side ILD material layer 60. As is shown in FIG. 9B, the back side power rail 58 has a first surface that contacts the logic device back side source/drain contact structure 38, a second surface of the back side power rail 58 that is opposite the first surface, will subsequently be in contact with the contact via structure 62 that is formed in the logic device region 102, and the subsequently formed contact via structure 62 in the logic device region 102 will provide an electrical connection of the back side power rail 58 to the back side power distribution network 64 that will be subsequently formed in the logic device region 102. As is shown in FIG. 9A, the PCM-containing pillar and the PCM dielectric spacer 56 are embedded in the lower portion of the back side ILD material layer 60.

A contact via structure 62 is then formed in both the PCM device region 100 and the logic device region 102. Each contact via structure 62 is composed of an electrically conductive metal or an electrically conductive metal alloy. Exemplary electrically conductive materials that can be used in providing the contact via structure 62 include, but are not limited to, copper (Cu), aluminum (Al), tungsten (W) or a Cu—Al alloy. Each contact via structure 62 can be formed by first providing a contact via opening in the back side ILD material layer 60. The contact via openings can be formed by lithography and etching. In the PCM device region 100, this contact via extends down through the back side ILD material layer 60 and physically exposed a surface of the second electrode 54. In the logic device region 102, this contact via opening extends through the back side ILD material layer 60 and physically exposes a surface of the back side power rail 58. Next, the electrically conductive material is formed in each of the contact via openings utilizing a deposition process. A planarization process can follow the deposition process. In some embodiments, a diffusion barrier material layer (such as, for example, Ti or Ta) is formed deposited along the sidewalls of each of the contact via openings, followed by deposition of the electrically conductive material, and then followed by a planarization process.

Next, the back side power distribution network 64 is formed in the both the PCM device region 100 and the logic device region 102. The back side power distribution network 64 is composed of well known elements that are configured to distribute power to both the device regions. The back side power distribution network 64 can be formed utilizing techniques well known to those skilled in the art. In the PCM device region 100, the back side power distribution network 64 is electrically connected to the top electrode 54 of the PCM-containing pillar by the contact via structure 62 that is present in the PCM device region 100. In the logic device region 102, the back side power distribution network 64 is electrically connected to the back side power rail 58 by the contact via structure 62 that is present in the logic device region 102.

FIG. 9A illustrates an exemplary structure of the present application which includes a PCM including at least a PCM element 52 located in a PCM device region 100 and on a back side of a wafer. The structure further includes a first FET (i.e., one of the nanosheet containing FETs) located in the PCM device region 100 and on a front side of the wafer, and a PCM back side source/drain contact structure 39S is also present that connects the PCM to a first source/drain structure 22 of the first FET that is present in the PCM device region 100. In this exemplary structure shown in FIG. 9A, the PCM back side source/drain contact 39S is spaced apart from the PCM element 52 by a heater (44/46/48). In such embodiments, the heater serves as a first electrode of the PCM memory. In such embodiments, the PCM back side source/drain contact structure 39S and the heater are located in a contact opening 42 that is present in a back side dielectric material stack 34/36. In such embodiments, the PCM element 52 is present in a PCM-containing pillar that is located on a surface of the heater and a surface of the back side dielectric material stack 34/36, the PCM-containing pillar includes a second electrode 54 located on the PCM element 52, and a PCM dielectric spacer 56 located adjacent to the PCM-containing pillar. In such embodiments, a back side power distribution network 64 can be located in the PCM device region 100, wherein the back side power distribution network 64 is connected to the second electrode 54 by a contact via structure 62. In such embodiments, the contact via structure 62 and the PCM-containing pillar are embedded in a back side interlayer (ILD) material layer 60 that is positioned between the back side power distribution network 64 and the back side dielectric material stack 34/36. In such embodiments, a front side source/drain contact structure 28 can connect a second source/drain structure 22 of the first FET transistor to a front side back-end-of-the-line (BEOL) structure 30. In such embodiments, a carrier wafer 32 can be located on a surface of the front side BEOL structure 30.

Figures 10A, 10B:
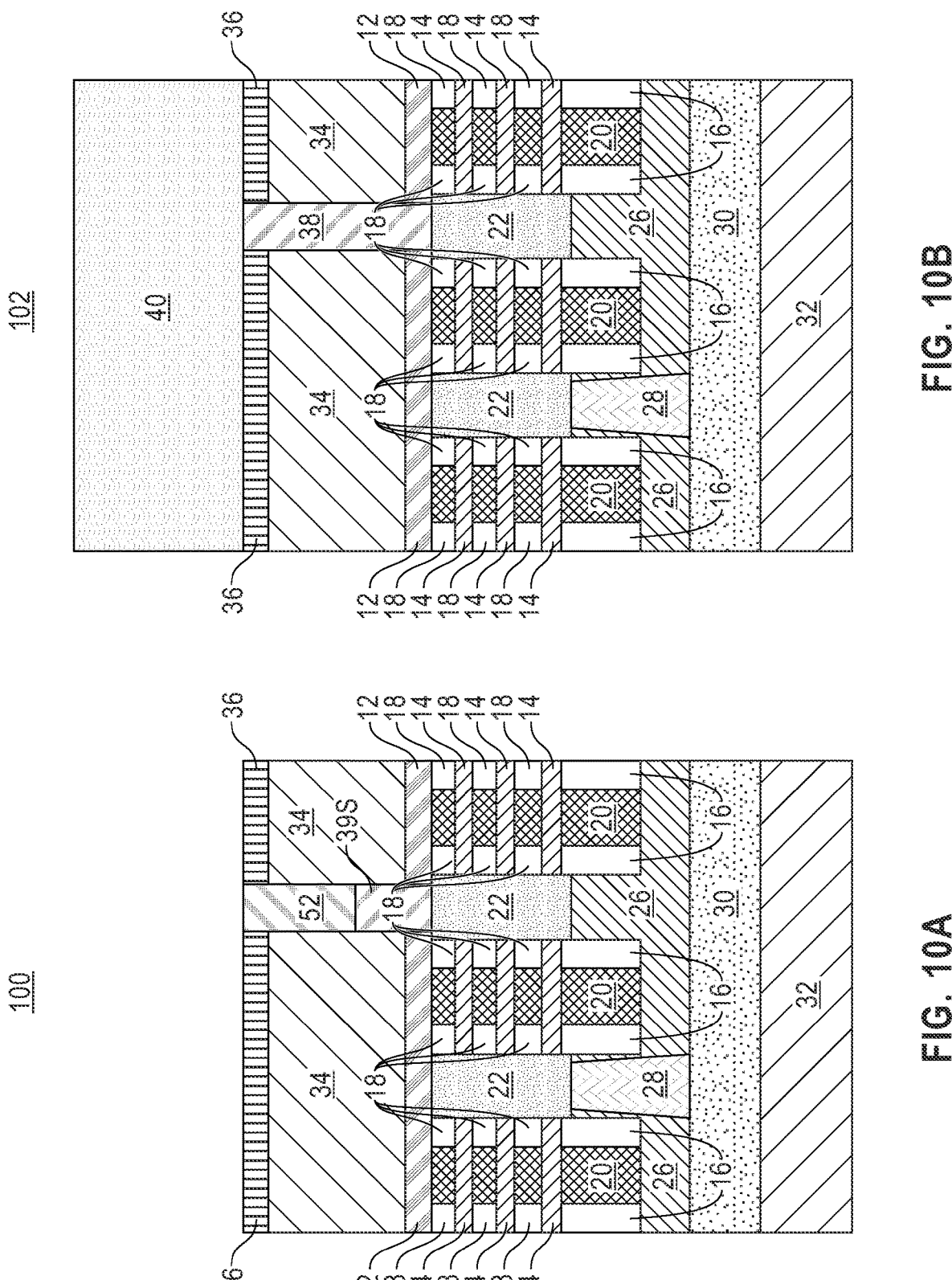
FIG. 10A-10B are cross sectional views of the exemplary structures shown in FIGS. 6A and 6B, respectively, after forming a phase change memory element on the recessed PCM device back side source/drain contact structure, in accordance with another embodiment of the present application.

Referring now to FIG. 10A-10B, there are illustrated the exemplary structures shown in FIGS. 6A and 6B, respectively, after forming a phase change memory element 52 on the recessed PCM device back side source/drain contact structure 39S, in accordance with another embodiment of the present application. In this embodiment, the phase change memory element 52 is contained within the upper portion of the contact opening 43 that is formed in the back side dielectric material stack. The phase change memory element 52 includes one of the phase change materials mentioned above, and in this embodiment, the phase change memory element 52 can be formed by deposition of the phase change material followed by a planarization process. In this embodiment, the phase change memory element 52 has a first surface that is in direct contact with the recessed PCM device back side source/drain contact structure 39S, and a second surface that is opposite the first surface that is coplanar with a topmost surface of the back side dielectric material stack.

Figure 11B:
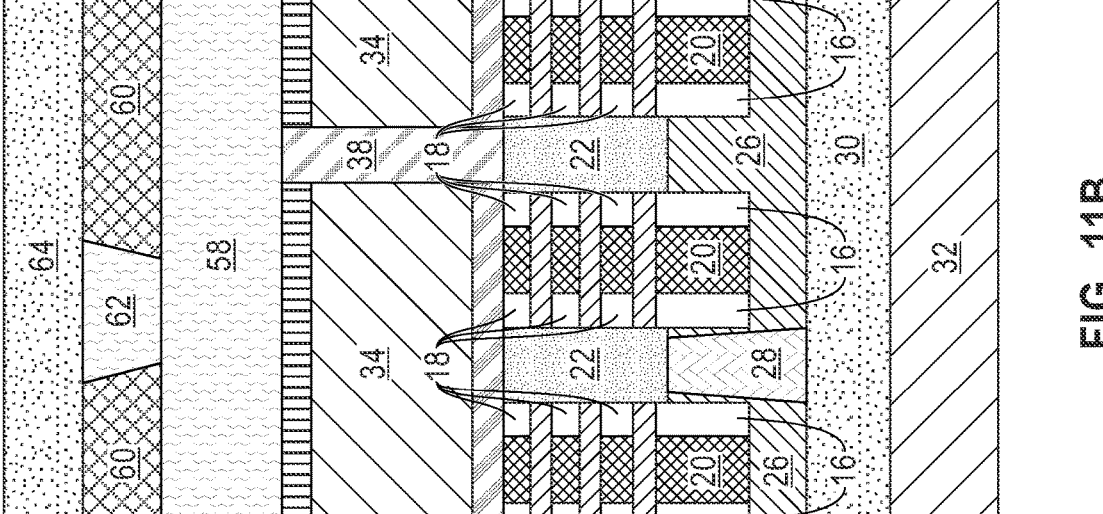
FIG. 11A-11B are cross sectional views of the exemplary structures shown in FIGS. 10A and 10B, respectively, after removing the block mask from the logic device region, forming a first portion of a back side ILD material layer in both the PCM device region and the logic device region, forming a back side power rail in the lower portion of the back side ILD material layer in both the PCM device region and the logic device region, forming an upper portion of the back side ILD material layer in both the PCM device region and the logic device region, forming a contact via structure in both the PCM device region and the logic device region, and forming a back side signal line in the PCM device region, and a back side power distribution network in the logic device region.
Figure 11A:
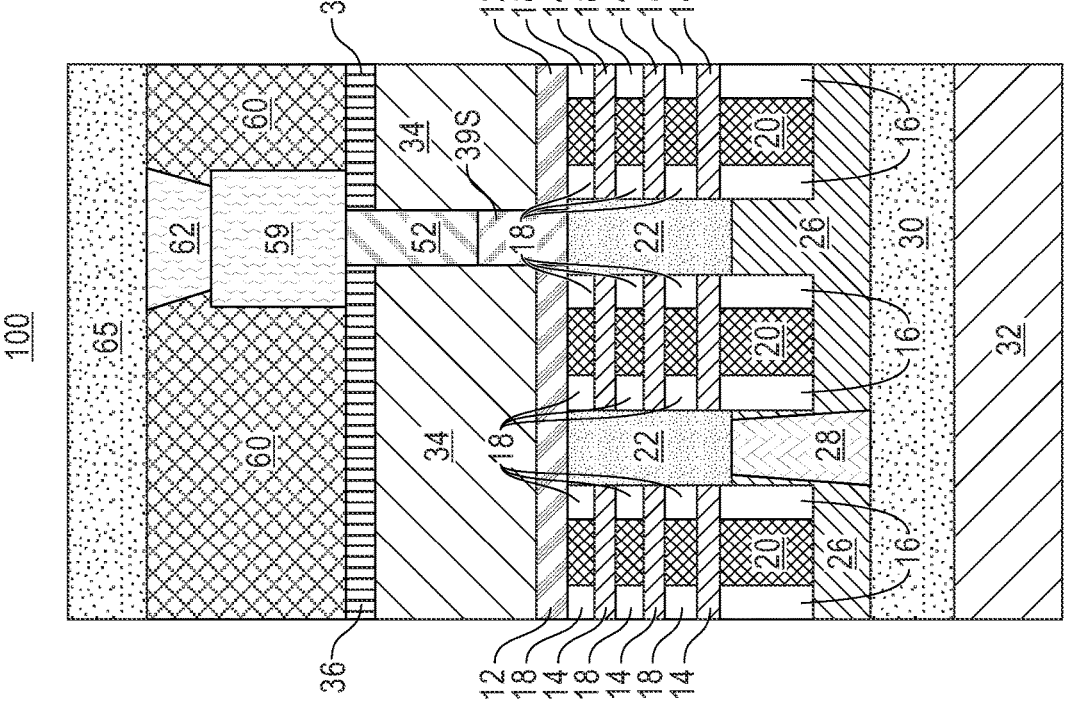

Referring now to FIG. 11A-11B, there are illustrated the exemplary structures shown in FIGS. 10A and 10B, respectively, after removing the block mask 40 from the logic device region 102, forming a first portion of a back side ILD material layer 60 in both the PCM device region 100 and the logic device region 102, forming a back side power rail 59, 58 in the lower portion of the back side ILD material layer 60, forming an upper portion of the back side ILD material layer 10 in both the PCM device region 100 and the logic device region 102, forming a contact via structure 62 in both the PCM device region 100 and the logic device region 102, and forming a back side signal line 65 in the PCM device region 100, and a back side power distribution network 64 in the logic device region 102. In this embodiment, back side power rail 59 that is formed in the PCM device region 100 can serve as the second electrode of the PCM.

In this embodiment, a lower portion of the back side ILD material layer 60 is first formed utilizing one of the deposition processes mentioned above in forming the front side ILD material layer 24. The lower portion of the back side ILD material layer 60 can include one of the dielectric materials mentioned above for the front side ILD material layer 24.

Back side power rail openings are then formed in the lower portion of the back side ILD material layer 60 by lithography and etching. The back side power rail opening in the PCM device region 100 runs along the length direction of each semiconductor channel material nanosheet 14, while the back side power rail opening in the logic device region runs parallel to the width direction of each semiconductor channel material nanosheet 14. The back side power rail 59 and the back side power rail 58 are then formed in each of the these openings. The back side power rail 59 and the back side power rail 58 include one of power rail conductive materials mentioned above. The back side power rail 59 and the back side power rail 58 can be formed by deposition of a power rail conductive material, followed by a planarization process.

An upper portion of the back side ILD material layer 60 is then formed utilizing one of the deposition processes mentioned above in forming the front side ILD material layer 24. The upper portion of the back side ILD material layer 60 can include one of the dielectric materials mentioned above for the front side ILD material layer 24. The upper portion of the back side ILD material layer 60 is typically composed of a compositionally same dielectric material as the lower portion of the back side ILD material layer 60.

Contact via structures 62 and the back side power distribution network 64 that are employed in this embodiment are the same as those employed in the previous embodiment. Thus, the materials and methods mentioned above for providing contact via structure 62 and the back side power distribution network 64 are applicable here for this embodiment of the present application.

The signal line 65 includes any electrically conductive material including, but not limited to, Cu, Al, Co, W or alloys thereof. The signal line 65 can be formed either prior to, or after the back side power distribution network 64. The electrically conductive material that provides the signal line 65 can be formed utilizing a deposition process such as, for example, CVD, PECVD, PVD, ALD, or sputtering.

In this embodiment, the contact via structure 62 in the PCM device region 100 electrically connects the signal line 65 to the back side power rail 59. Also, and in this embodiment, the contact via structure 62 in the logic device region 102 electrically connects the back side power distribution network 64 to the back side power rail 58.

FIG. 11A illustrates another exemplary structure of the present application which includes a PCM including at least a PCM element 52 located in a PCM device region 100 and on a back side of a wafer. The structure further includes a first FET (i.e., one of the nanosheet containing FETs) located in the PCM device region 100 and on a front side of the wafer, and a PCM back side source/drain contact structure 39S is also present that connects the PCM to a first source/drain structure 22 of the first FET that is present in the PCM device region 100. In this structure, the PCM back side source/drain contact structure 39S and the PCM element 52 are located in a contact opening 42 that is present in a back side dielectric material stack 34/36. In such embodiments, a back side power rail 59 can be located on a surface of the PCM element 52 and a surface of the back side dielectric material stack 34/36. In such embodiments, a back side signal line 65 can be located in the PCM device region 100, wherein the back side signal line 65 is connected to the back side power rail 59 by a contact via structure 62. In such embodiments, the back side power rail 59 and the contact via structure 62 are embedded in a back side ILD material layer 60 that is positioned between the back side signal line 65 and the back side dielectric material stack 34/36. In such embodiments, a front side source/drain contact structure 28 can connect a second source/drain structure 22 of the first FET to a front side BEOL structure 30. In such embodiments, a carrier wafer 32 can be located on a surface of the front side BEOL structure 30.

Figures 12A, 12B:
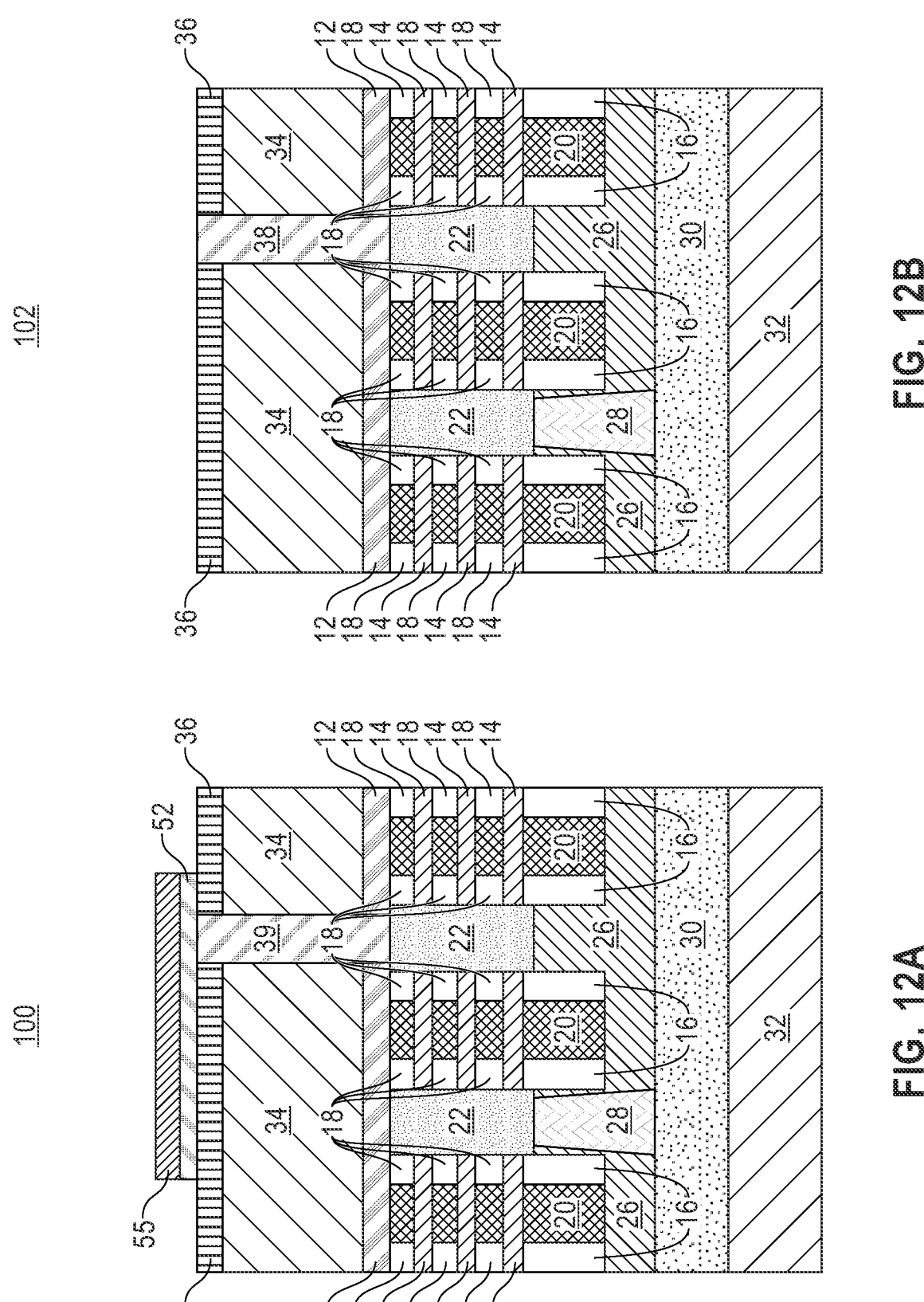
FIG. 12A-12B are cross sectional views of the exemplary structures shown in FIGS. 5A and 5B, respectively, after forming a PCM element and a dielectric material layer in the PCM device region and on the back side of the wafer.

Referring now to FIG. 12A-12B, there are illustrated the exemplary structures shown in FIGS. 5A and 5B, respectively, after forming a PCM element 52 and a dielectric material layer 55 in the PCM device region 100 and on the back side of the wafer. The PCM element 52 of this embodiment includes one of the phase change memory materials mentioned previously above. The phase change memory material that provides the PCM element 52 of this embodiment can be formed utilizing one of the deposition processes mentioned above in forming the PCM element 52 shown in FIG. 8A. The PCM element 52 of this embodiment can have a thickness within the thickness range mentioned above for the PCM element shown in FIG. 8A. The dielectric material layer 55 can include any dielectric material such as, for example, silicon nitride, silicon dioxide, or silicon oxynitride. The dielectric material layer 55 can be formed by a deposition such as, for example, CVD, PECVD, PVD or ALD. The dielectric material layer 55 can have a thickness from 10 nm to 100 nm; although other thicknesses for the dielectric material layer are possible. After deposition of the dielectric material and the phase change memory material, a patterning process is used to provide the dielectric material layer 55 and the PCM element 54 shown in FIG. 12A.

Figures 13A, 13B:
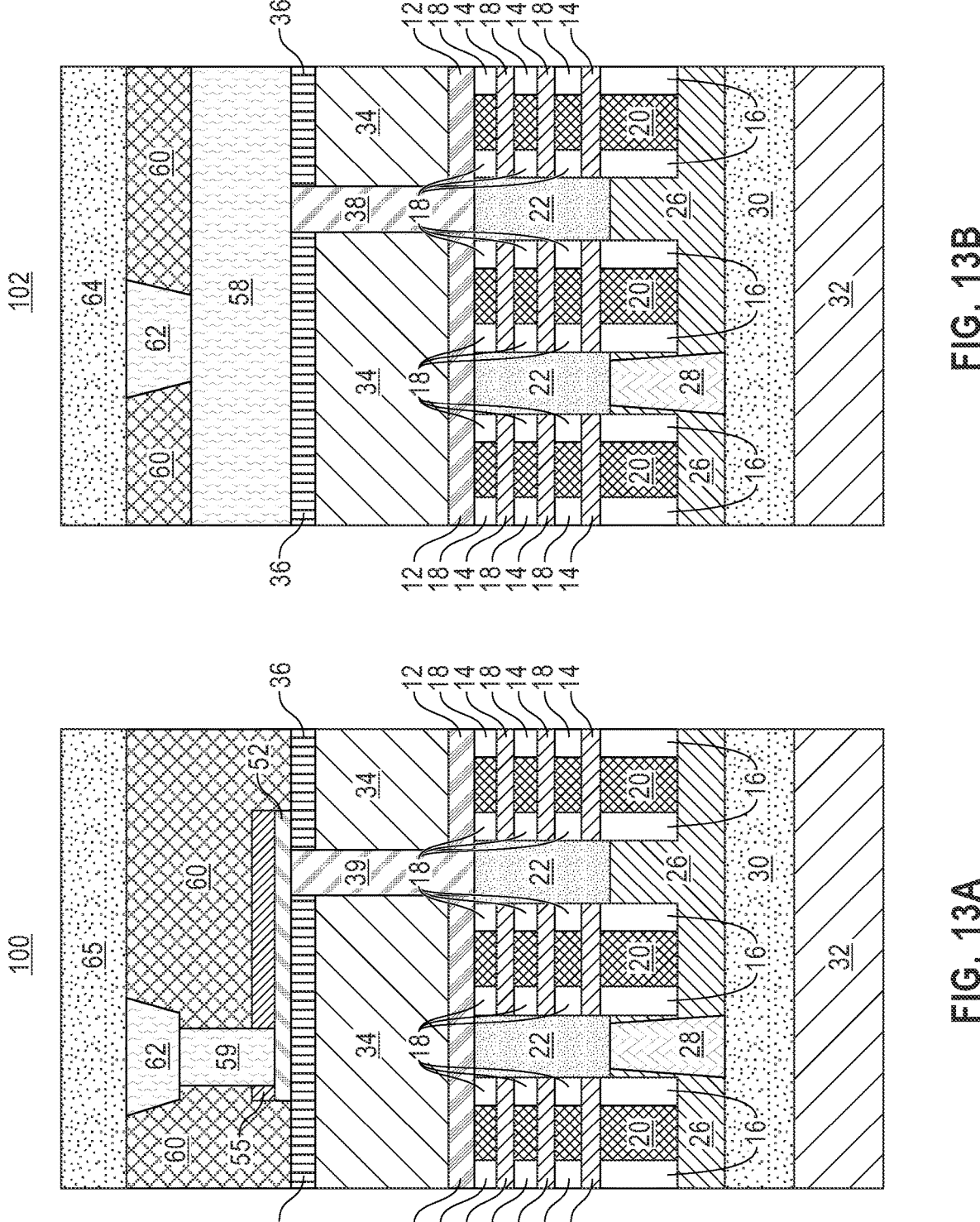
FIG. 13A-13B are cross sectional views of the exemplary structures shown in FIGS. 12A and 12B, respectively, after forming a first portion of a back side ILD material layer in both the PCM device region and the logic device region, forming a back side power rail in the lower portion of the back side ILD material layer in both the PCM device region and the logic device region, forming an upper portion of the back side ILD material layer in both the PCM device region and the logic device region, forming a contact via structure in both the PCM device region and the logic device region, and forming a back side signal line in the PCM device region, and a back side power distribution network in the logic device region.

Referring now to FIG. 13A-13B, there are illustrated the exemplary structures shown in FIGS. 12A and 12B, respectively, after forming a first portion of a back side ILD material layer 60 in both the PCM device region 100 and the logic device region 102, forming a back side power rail 59, 58 in the lower portion of the back side ILD material layer 60 in both the PCM device region 100 and the logic device region 102, forming an upper portion of the back side ILD material layer 60 in both the PCM device region 100 and the logic device region 102, forming a contact via structure 62 in both the PCM device region 100 and the logic device region 102, and forming a back side signal line 65 in the PCM device region 100, and a back side power distribution network 64 in the logic device region 102. In this embodiment, back side power rail 59 can serve as a second electrode of the PCM.

Back side ILD material layer 60, contact via structure 62, the back side power distribution network 64, back side power rail 59, 58, and signal line 65 that are employed in this embodiment are the same as those employed in the previous embodiment. Thus, the materials and methods mentioned above for providing those elements are applicable here for this embodiment of the present application. In this embodiment, back side power rail opening that is formed in the PCM device region extends through the dielectric material layer 55 and physically exposes a surface of the PCM element 52.

In this embodiment, the contact via structure 62 in the PCM device region 100 electrically connects the signal line 65 to the back side power rail 59. Back side power rail 59 extends through the dielectric material layer 55 and contacts a surface of the PCM element 52. Also, and in this embodiment, the contact via structure 62 in the logic device region 102 electrically connects the back side power distribution network 64 to the back side power rail 58.

FIG. 13A illustrates another exemplary structure of the present application which includes a PCM including at least a PCM element 52 located in a PCM device region 100 and on a back side of a wafer. The structure further includes a first FET (i.e., one of the nanosheet containing FETs) located in the PCM device region 100 and on a front side of the wafer, and a PCM back side source/drain contact structure 39S is also present that connects the PCM to a first source/drain structure 22 of the first FET that is present in the PCM device region 100. In this structure, the PCM back side source/drain contact structure 39 entirely fills a contact opening 42 that is present in a back side dielectric material stack 34/36, and the PCM element 52 is present on the PCM back side source/drain structure 39 and the back side dielectric material stack 34/36, and a dielectric material layer 55 is located on a surface of the PCM element 52. In such embodiments, a back side ILD material layer 60 can be located on the back side dielectric material stack 34/36 and embedding the PCM element 52 and the dielectric material layer 55. In such embodiments, a back side signal line 65 can be located on the back side ILD material layer 60, wherein the back side signal line 65 is connected to the PCM element 52 by a contact via structure 62 and a back side power rail, 59 wherein the contact via structure 62 forms a first interface with the back side signal layer 65 and a second interface with the back side power rail 59, and the back side power rail 59 forms an interface with the PCM element 52 and passes through the dielectric material layer 55. In such embodiments, a front side source/drain contact structure 28 can connect a second source/drain structure of the first FET to a front side BEOL structure 30. A carrier wafer 32 can be located on a surface of the front side BEOL structure 30.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a phase change memory (PCM) comprising at least a PCM element located in a PCM device region and on a back side of a wafer;
a first field effect transistor (FET) located in the PCM device region and on a front side of the wafer;
a PCM back side source/drain contact structure connecting the PCM to a first source/drain structure of the first FET that is present in the PCM device region; and
a heater, wherein the PCM back side source/drain contact structure is spaced apart from the PCM element by the heater.

2. The semiconductor structure of claim 1, wherein the PCM back side source/drain contact structure and the heater are located in a contact opening that is present in a back side dielectric material stack.

3. The semiconductor structure of claim 2, wherein the PCM element is present in a PCM-containing pillar that is located on a surface of the heater and a surface of the back side dielectric material stack, the PCM-containing pillar including a second electrode located on the PCM element, and a dielectric spacer located adjacent to the PCM-containing pillar.

4. The semiconductor structure of claim 3, further comprising a back side power distribution network located in the PCM device region, wherein the back side power distribution network is connected to the second electrode by a contact via structure.

5. The semiconductor structure of claim 4, wherein the contact via structure and the PCM-containing pillar are embedded in a back side interlayer (ILD) material layer that is positioned between the back side power distribution network and the back side dielectric material stack.

6. The semiconductor structure of claim 1, further comprising a front side source/drain contact structure connecting a second source/drain structure of the first FET transistor to a front side back-end-of-the-line (BEOL) structure.

7. The semiconductor structure of claim 6, further comprising a carrier wafer located on a surface of the front side BEOL structure.

8. The semiconductor structure of claim 1, further comprising a second FET located in the front side of the wafer and in a logic device region that is located laterally adjacent to the PCM device region, wherein a logic device back side source/drain contact structure connects a first source/drain structure of the second FET to a back side power rail, and a logic device front side source/drain contact structure connects a second source/drain structure of the second FET to a front side BEOL structure.

9. The semiconductor structure of claim 8, further comprising a back side power distribution network connected to the back side power rail present in the logic device region by a contact via structure.

10. The semiconductor structure of claim 1, wherein the FET is a nanosheet transistor.

11. The semiconductor structure of claim 10, further comprising a bottom dielectric isolation layer located beneath the nanosheet transistor.

12. The semiconductor structure of claim 1, wherein the heater comprises a first metal nitride layer, a second metal nitride layer and a third metal nitride layer.

13. The semiconductor structure of claim 12, wherein the first metal nitride layer and third metal nitride layer are compositionally different from the second metal nitride layer, and the first metal nitride layer is compositionally the same as the third metal nitride layer.

14. The semiconductor structure of claim 12, wherein the first metal nitride layer and third metal nitride layer are compositionally different from the second metal nitride layer 46, and the first metal nitride layer is compositionally different than the third metal nitride layer.

15. The semiconductor structure of claim 12, wherein the first metal nitride layer is composed of TaN, the second metal nitride layer is composed of TiN, and the third metal nitride layer is composed of TaN.

* * * * *